US012691487B2

(12) United States Patent　(10) Patent No.:　US 12,691,487 B2

Kishigami　(45) Date of Patent:　Jul. 28, 2026

(54) METHOD, DEVICE, AND PROGRAM OF DESIGNING PRESS FORMING DIE, AND METHOD OF MANUFACTURING PRESS FORMED PART

(71) Applicant: JFE STEEL CORPORATION, Tokyo (JP)

(72) Inventor: Yasuhiro Kishigami, Tokyo (JP)

(73) Assignee: JFE STEEL CORPORATION, Tokyo (JP)

( * ) Notice: Subject to any disclaimer, the term of this patent is extended or adjusted under 35 U.S.C. 154(b) by 206 days.

(21) Appl. No.: 18/835,807

(22) PCT Filed: Feb. 10, 2023

(86) PCT No.: PCT/JP2023/004617

§ 371 (c)(1),
(2) Date: Aug. 5, 2024

(87) PCT Pub. No.: WO2023/176231

PCT Pub. Date: Sep. 21, 2023

(65) Prior Publication Data

US 2025/0128307 A1　Apr. 24, 2025

(30) Foreign Application Priority Data

Mar. 17, 2022　(JP) ................................. 2022-042034
Nov. 29, 2022　(JP) ................................. 2022-189757

(51) Int. Cl.
B21D 22/00　(2006.01)
B21D 37/20　(2006.01)
G06F 30/23　(2020.01)

(52) U.S. Cl.
CPC ............. B21D 22/00 (2013.01); G06F 30/23 (2020.01); B21D 37/20 (2013.01)

(58) Field of Classification Search
CPC .......... G06F 30/23; G06F 30/20; G06F 30/17; G06F 30/10; G06F 2113/22; G06F 2113/24; B21D 37/20
See application file for complete search history.

(56) References Cited

U.S. PATENT DOCUMENTS

2017/0140081 A1* 5/2017 Suzuki ................... B21D 22/00
2017/0297076 A1* 10/2017 Watanabe ............. B21D 22/02
2019/0358925 A1* 11/2019 Schmitt ................ B30B 15/022

FOREIGN PATENT DOCUMENTS

JP　　2005-138120 A　6/2005
JP　　2005138119 A　*　6/2005

(Continued)

OTHER PUBLICATIONS

Translation of JP-2005138119.*

(Continued)

*Primary Examiner* — Bobby Yeonjin Kim
(74) *Attorney, Agent, or Firm* — Oliff PLC

(57)　　　　ABSTRACT

A designing method of a press forming die reduces a press forming load and includes: making a die model in which a surface of the press forming die is provided with a virtual thickness by a nonrigid two-dimensional element; setting stiffness distributions of the die model by making a boundary condition of the two-dimensional element vary depending on a portion of the die model; acquiring a press forming load by performing a press forming analysis by using the die model in which the stiffness distributions are set; determining whether the press forming load is within a predetermined range of the press forming load; determining the set stiffness distributions of the die model as design stiffness distributions of the press forming die in a case where it is determined that the press forming load is within the predetermined range of the press forming load.

4 Claims, 7 Drawing Sheets

(56)         References Cited

FOREIGN PATENT DOCUMENTS

| JP | 2010-207907 | A  | 9/2010  |
| JP | 2011-251318 | A  | 12/2011 |
| JP | 2020-514060 | A  | 5/2020  |
| WO | 2016/017775 | A1 | 2/2016  |

OTHER PUBLICATIONS

Shoichiro Ohmachi; "Load examination of press forming computer aided engineering (CAE) using 3DSimSTAMP, and application of the same;" Press Working, Nikkan Kogyo Shimbun, Ltd.; 2015; pp. 62-65; vol. 53, No. 3.

Apr. 18, 2023 Search Report issued in International Patent Application No. PCT/JP2023/004617.

Xu et al., "Topology Optimization of Die Weight Reduction for High-Strength Sheet Metal Stamping," International Journal of Mechanical Sciences, 2012, vol. 59, pp. 73-82.

Mar. 26, 2025 Extended Search Report issued at European Patent Application No. 23770192.5.

* cited by examiner

START

PRESS FORMING DIE DESIGN STIFFNESS DISTRIBUTION ACQUIRING STEP    S11

PRESS FORMING DIE MANUFACTURING STEP    S13

PRESS FORMING STEP    S15

END (a)

(b)

(a)

(b)

METHOD, DEVICE, AND PROGRAM OF DESIGNING PRESS FORMING DIE, AND METHOD OF MANUFACTURING PRESS FORMED PART

FIELD

The present invention relates to a method, device, and program of designing a press forming die capable of reducing a press forming load that is associated with press forming of a metal member and that acts on the press forming die, and a method of manufacturing a press formed part. The metal member may be a hot rolled steel sheet, a cold rolled steel sheet, a galvanized steel sheet obtained by subjecting a steel sheet to surface treatment (such as electro-galvanizing, hot-dip galvanizing, or organic coating treatment), or a sheet made of various metals such as a stainless steel, aluminum, and magnesium.

BACKGROUND

Application of a high-tensile steel sheet in an automotive body is expanding due to an increasing need for improving fuel efficiency by weight reduction of the automotive body and for improving collision safety. With respect to the high-tensile steel sheet, deterioration in formability due to low ductility and deterioration in dimensional accuracy due to high material strength are problems to be solved for application of the high-tensile steel sheet.

In addition, since a press forming load increases when the high-tensile steel sheet is press-formed, it is necessary to change a press forming process line or to divide parts. Such an increase in the press forming load is also a hindrance to the application of the high-tensile steel sheet. Thus, there is a demand for a press forming die capable of reducing the press forming load without changing the press forming process line or dividing parts.

In this regard, Patent Literature 1 discloses a method of reducing a press forming load by divisionally moving a press forming die and sequentially performing forming.

In addition, three-dimensional computer aided design (CAD) has been conventionally used for structural design of a press forming die that is a three-dimensional structure, and a solid model (three-dimensional element) has been used for three-dimensional modeling of the press forming die. When the die model is made by the solid model, a contact between parts included in the press forming die is possible, and designing of the press forming die in consideration of interlocking between die parts becomes possible. Non-Patent Literature 1 discloses a method of predicting a press forming load with a press forming die being an elastic body.

CITATION LIST

Patent Literature

Patent Literature 1: Japanese Patent Application Laid-open No. 2010-207907

Non Patent Literature

Non Patent Literature 1: Shoichiro Ohmachi, "Load examination of press forming computer aided engineering (CAE) using 3DSimSTAMP, and application of the same", Press Working, Nikkan Kogyo Shimbun, Ltd., March 2015, Vol. 53, No. 3, p. 62-65

SUMMARY

Technical Problem

Although Patent Literature 1 proposes a structure in which a press forming load is reduced by division of a press forming die, a method of examining a press-forming die structure is not described.

Non-Patent Literature 1 discloses a case of a press forming analysis by a die model using a solid model (three-dimensional element) of an elastic body. In a case where stiffness of a press forming die is designed as a structure of the press forming die, it is necessary to make a die model by using a solid model (three-dimensional element) of an elastic body, perform finite element analysis (FEM analysis) by using the made die model of the three-dimensional element, change the structure of the die model in such a manner as to reduce a press forming load, and design the press-forming die structure. However, an FEM analysis calculation in which the press forming die is modeled by utilization of the solid model (three-dimensional element) requires calculation time, and modeling of the die model is required every time the structure of the die model is changed, whereby it takes time to design the die.

The present invention has been made in view of the above problems, and an object thereof is to provide a method, device, and program of designing a press forming die which can be designed in a short period and in which a press forming load is reduced. Furthermore, another object of the present invention is to provide a manufacturing method of a press formed part in which method the press formed part is manufactured with a real press-forming die manufactured based on a designed press forming die.

Solution to Problem

In examining a method of designing a structure of a press forming die capable of reducing a press forming load by using a press forming analysis using a finite element method, the inventors first examined a phenomenon in which the press forming load increases.

From the examination by press forming tests and the press forming analysis, the inventors have found that the press forming load rapidly increases near the bottom dead center of press-forming. In addition, the inventors have found that a load near the bottom dead center of pressing includes not only reaction force due to deformation of the press formed part (blank) but also reaction force of controlling elastic deformation of the press forming die by stiffness due to the press-forming die structure. The elastic deformation of the press forming die is caused by contact between facing press forming dies via a press formed part that almost reaches a deformation limit.

Then, the inventors have obtained an idea that, in a portion where a press forming load (surface pressure) acts, the press forming load (surface pressure) of the portion can be reduced by reduction of the stiffness of the press forming die and reduction of the reaction force of controlling the elastic deformation of the press forming die. In addition, the inventors have considered that, in order to reduce the stiffness of the press forming die, analysis is to be performed with a focus on stiffness distributions of the press forming die when the press forming analysis using the finite element method is performed.

Furthermore, the inventors have found the following. That is, in order to provide the stiffness distributions of the press forming die, it is not necessary to form the press forming die into a solid model (three-dimensional element) while keeping the press-forming die structure as is conventionally performed. When the press forming die is formed into a model with a surface of the press forming die being provided with a virtual thickness as a shell model (two-dimensional element) having nonrigidity (elasticity or elasto-plasticity), and stiffness is provided by a boundary condition, it is possible to obtain press load estimation accuracy substantially the same as that in a case of solid modeling and to shorten the calculation time. The present invention is based on such findings, and specifically includes the following configurations.

A designing method of a press forming die according to the present invention reduces a press forming load, and includes: a die model making step of making a die model in which a surface of the press forming die is provided with a virtual thickness by a nonrigid two-dimensional element; a die model stiffness distribution setting step of setting stiffness distributions of the die model by making a boundary condition of the two-dimensional element vary depending on a portion of the die model; a press forming load acquiring step of acquiring a press forming load by performing a press forming analysis by using the die model in which the stiffness distributions are set; a press forming load determining step of determining whether the press forming load is within a predetermined range of the press forming load; and a press forming die design stiffness determining step of determining the set stiffness distributions of the die model as design stiffness distributions of the press forming die in a case where it is determined in the press forming load determining step that the press forming load is within the predetermined range of the press forming load, and changing the stiffness distributions of the die model in the die model stiffness distribution setting step and repeating the press forming load acquiring step and the press forming load determining step until the press forming load falls within the predetermined range of the press forming load in a case where it is determined in the press forming load determining step that the predetermined range of the press forming load is not within the predetermined range of the press forming load, and determining the changed stiffness distributions of the die model as the design stiffness distributions of the press forming die when the press forming load falls within the predetermined range of the press forming load.

The boundary condition in the die model stiffness distribution setting step may be any one or combination of: displacement restraint; Young's modulus; a sheet thickness; density; mass; and yield strength.

The nonrigid two-dimensional element may be an elastic or elasto-plastic two-dimensional element.

A designing device of a press forming die according to the present invention reduces a press forming load, and includes: a die model making unit configured to make a die model in which a surface of the press forming die is provided with a virtual thickness by a nonrigid two-dimensional element; a die model stiffness distribution setting unit configured to set stiffness distributions of the die model by making a boundary condition of the two-dimensional element vary depending on a portion of the die model; a press forming load acquisition unit configured to acquire a press forming load by performing a press forming analysis by using the die model in which the stiffness distributions are set; a press forming load determination unit configured to determine whether the press forming load is within a predetermined range of press forming load; and a press forming die design stiffness determination unit configured to determine the set stiffness distributions of the die model as design stiffness distributions of the press forming die in a case where it is determined by the press forming load determination unit that the press forming load is within the predetermined range of press forming load, and change the stiffness distributions of the die model in the die model stiffness distribution setting unit and repeat the processing of the press forming load acquisition unit and the press forming load determination unit until the press forming load falls within the predetermined range of the press forming load in a case where it is determined by the press forming load determination unit that the predetermined range of the press forming load is not within the predetermined range of press forming load, and determine the changed stiffness distributions of the die model as the design stiffness distributions of the press forming die when the press forming load falls within the predetermined range of the press forming load.

A designing program of a press forming die according to the present invention causes a computer to function as the designing device of the press forming die according to the present invention.

A manufacturing method of a press formed part according to the present invention includes: a press forming die design stiffness distributions acquiring step of acquiring design stiffness distributions of a press forming die by the designing method of a press forming die according to the present invention; a press forming die manufacturing step of manufacturing a real press-forming die based on the acquired design stiffness distributions of the press forming die; and a press forming step of performing press forming by using the real press-forming die.

Advantageous Effects of Invention

According to the present invention, a structure of a press forming die capable of reducing a press forming load can be designed in a short time. As a result, it is possible to manufacture a press formed part by using a real press-forming die having an appropriate press forming load corresponding to pressurizing capacity of a press machine. As a result, it is possible to control a decrease in a life of the press forming die due to excessive pressurization to the press forming die, and it is possible to control generation of a burr and the like of the press formed part and to improve manufacturing efficiency.

DESCRIPTION OF EMBODIMENTS

First Embodiment

Figure 1:
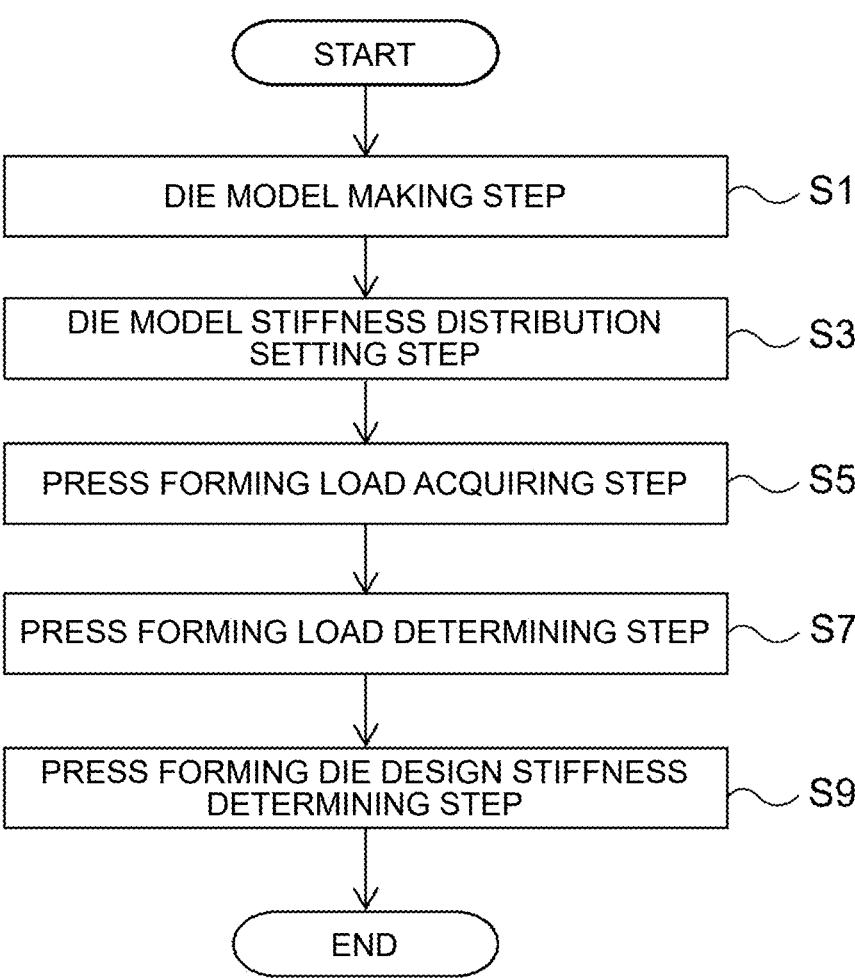
FIG. 1 is a flowchart of a designing method of a press forming die according to a first embodiment.

The present embodiment is a designing method of a press forming die capable of reducing a press forming load. As illustrated in FIG. 1, the designing method of the press forming die includes a die model making step (S1), a die model stiffness distribution setting step (S3), a press forming load acquiring step (S5), a press forming load determining step (S7), and a press forming die design stiffness determining step (S9). Each configuration will be described below.

<Die Model Making Step>

The die model making step S1 is a step of making a die model in which a surface of a press forming die is provided with a virtual thickness by a nonrigid two-dimensional element (shell element). The nonrigid body means an elastic body or an elasto-plastic body, and an elastic or elasto-plastic two-dimensional element may be used as the nonrigid two-dimensional element (shell element). Providing the shell element with the virtual thickness is one of procedures of when the shell element is used in a normal press forming analysis.

<Die Model Stiffness Distribution Setting Step>

The die model stiffness distribution setting step S3 is a step of setting the stiffness distributions of the die model by making a boundary condition of the two-dimensional element vary depending on a portion of the die model. The boundary condition may be a displacement restraint, Young's modulus, a sheet thickness, a density, mass, or yield strength. For example, in a case where the boundary condition is the displacement restraint, in a case where a specific range of the press forming die is set to have high rigidity, the boundary condition may be set in such a manner that displacement of the two-dimensional element in the portion having the high rigidity is restrained and deformation is prevented. Similarly, in a case where the boundary condition is the Young's modulus, the sheet thickness, the density, the mass, or the yield strength, in a case where a specific range of the press forming die is set to have high rigidity, the boundary condition may be set in such a manner that the Young's modulus, the sheet thickness, the density, the mass, or the yield strength of the two-dimensional element in the portion having the high rigidity is increased and that deformation becomes less likely.

<Press Forming Load Acquiring Step>

The press forming load acquiring step S5 is a step of performing a press forming analysis by using the die model in which the stiffness distributions are set, and acquiring the press forming load. The press forming load to be acquired may be a load applied to the entire press forming die or a contact pressure distribution of the press forming die.

<Press Forming Load Determining Step>

The press forming load determining step S7 is a step of determining whether the press forming load is within a predetermined range of the press forming load. The predetermined range of the press forming load is a maximum load of a press forming machine, load restriction for reducing wear of the press forming die, load restriction for reducing a vibration of the press forming die, or the like.

<Press Forming Die Design Stiffness Determining Step>

In the press forming die design stiffness determining step S9, in a case where it is determined in the press forming load determining step S7 that the press forming load is within the predetermined range of the press forming load, the set stiffness distributions of the die model are determined as design stiffness distributions of the press forming die. In addition, in a case where it is determined in the press forming load determining step S7 that the predetermined range of the press forming load is not satisfied, the stiffness distributions of the die model in the die model stiffness distribution setting step S3 are changed, and the press forming load acquiring step S5 and the press forming load determining step S7 are repeated until the predetermined range of the press forming load is satisfied. Then, when the predetermined range of the press forming load is reached, the changed stiffness distributions of the die model are determined as the design stiffness distributions of the press forming die.

In order to reflect the determined design stiffness distributions in the press forming die, for example, a thickness is changed or members having different Young's modulus are used according to a degree of the stiffness.

In the present embodiment, the press forming die is formed into a model with a surface of the press forming die being provided with a virtual thickness as a nonrigid (elastic or elasto-plastic) shell model (two-dimensional element), and stiffness is provided by the boundary condition. Thus, the FEM analysis calculation for acquiring the press forming load does not take time, and it is not necessary to perform modeling of the die model each time the stiffness distribution setting is changed. As a result, it becomes possible to design the structure of the press forming die capable of reducing a press forming load in a short time.

Second Embodiment

Figure 2:
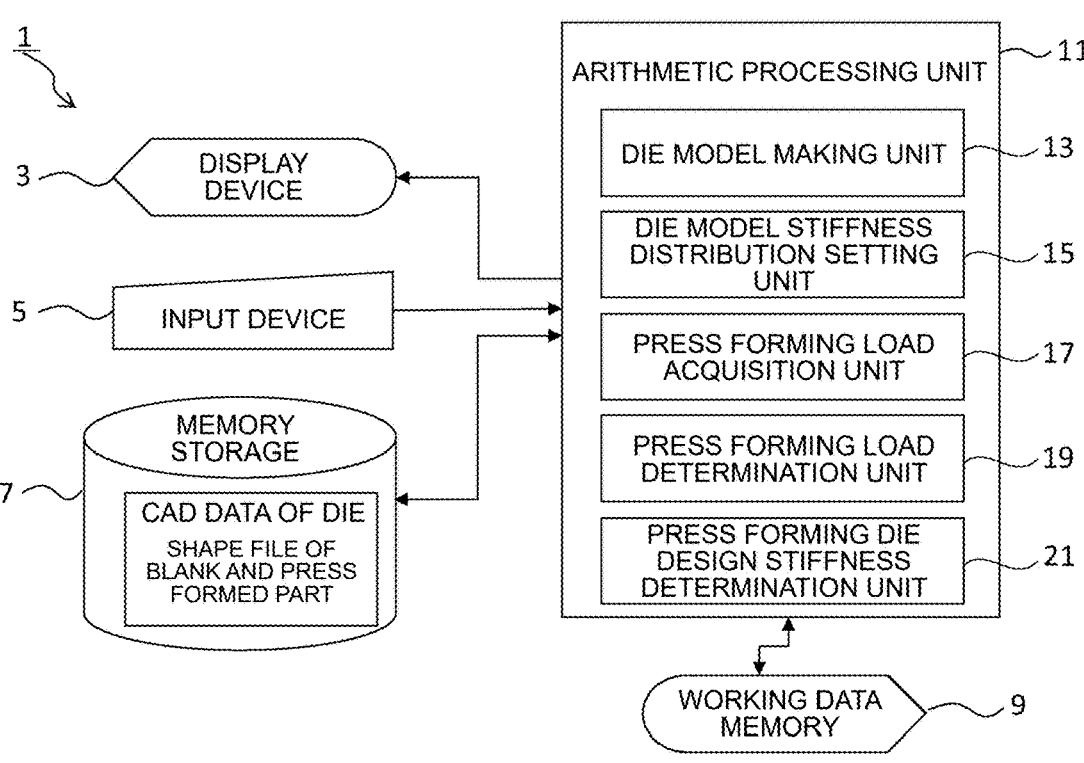
FIG. 2 is a block diagram illustrating a configuration of a designing device of a press forming die according to a second embodiment.

It is possible to realize the designing method of a press forming die described in the first embodiment by causing a computer to execute a preset program. A press forming die designing device as an example of such a device will be described in the present embodiment. As illustrated in FIG. 2, a designing device 1 of a press forming die according to the present embodiment is configured by a computer such as a personal computer (PC), and includes a display device 3, an input device 5, a memory storage 7, a working data memory 9, and an arithmetic processing unit 11. Then, the display device 3, the input device 5, the memory storage 7, and the working data memory 9 are connected to the arithmetic processing unit 11, and functions thereof are executed by commands from the arithmetic processing unit 11. Hereinafter, with a press formed part 31 illustrated in FIG. 3 as an analysis target, each configuration of the designing device 1 of the press forming die according to the present embodiment will be described.

<<Display Device>>

The display device 3 is used for displaying of an analysis result or the like, and includes an LCD monitor or the like.

<<Input Device>>

The input device 5 is used, for example, for display instructions of a blank, the press formed part 31, and the like and a condition input by an operator, and includes a keyboard, a mouse, and the like.

<<Memory Storage>>

The memory storage 7 is used, for example, to store CAD data of a die, various files such as shape files of the blank and the press formed part 31, and includes a hard disk or the like.

<<Working Data Memory>>

The working data memory 9 is used for temporary storage and calculation of data used by the arithmetic processing unit 11, and includes a random access memory (RAM) or the like.

<<Arithmetic Processing Unit>>

As illustrated in FIG. 2, the arithmetic processing unit 11 includes a die model making unit 13, a die model stiffness distribution setting unit 15, a press forming load acquisition unit 17, a press forming load determination unit 19, and a press forming die design stiffness determination unit 21, and is configured by a central processing unit (CPU). Each of these units functions when the CPU executes a predetermined program. The functions of the above units in the arithmetic processing unit 11 will be described below.

The die model making unit 13 is to make a die model in which a surface of a press forming die is provided with a virtual thickness by a nonrigid two-dimensional element, and executes the die model making step S1 described in the first embodiment.

The die model stiffness distribution setting unit 15 is to set stiffness distributions of the die model by making a boundary condition of the two-dimensional element vary depending on a portion of the die model, and executes the die model stiffness distribution setting step S3 described in the first embodiment.

The press forming load acquisition unit 17 is to perform a press forming analysis by using the die model in which the stiffness distributions are set and to acquire a press forming load, and executes the press forming load acquiring step S5 described in the first embodiment.

The press forming load determination unit 19 is to determine whether the press forming load is within a predetermined range of the press forming load, and executes the press forming load determining step S7 described in the first embodiment.

In a case where it is determined by the press forming load determination unit 19 that the press forming load is within the predetermined range of the press forming load, the press forming die design stiffness determination unit 21 determines the set stiffness distributions of the die model as design stiffness distributions of the press forming die. On the other hand, in a case where the press forming load determination unit 19 determines that the predetermined range of the press forming load is not satisfied, the press forming die design stiffness determination unit 21 changes the stiffness distributions of the die model in the die model stiffness distribution setting unit 15 and repeats the processing of the press forming load acquisition unit 17 and the press forming load determination unit 19 until the predetermined range of the press forming load is satisfied. Then, the press forming die design stiffness determination unit 21 determines the changed stiffness distributions of the die model as the design stiffness distributions of the press forming die when the predetermined range of the press forming load is reached. The press forming die design stiffness determination unit 21 executes the press forming die design stiffness determining step S9 described in the first embodiment.

According to the designing device 1 of the press forming die according to the present embodiment, a structure of the press forming die capable of reducing the press forming load can be designed in a short time similarly to the first embodiment.

As described above, the die model making unit 13, the die model stiffness distribution setting unit 15, the press forming load acquisition unit 17, the press forming load determination unit 19, and the press forming die design stiffness determination unit 21 in the designing device 1 of the press forming die of the present embodiment are realized by the CPU executing a predetermined program. Thus, a designing program of a press forming die according to the present invention can be specified as what causes the computer to function as the die model making unit 13, the die model stiffness distribution setting unit 15, the press forming load acquisition unit 17, the press forming load determination unit 19, and the press forming die design stiffness determination unit 21.

Third Embodiment

Figure 8:
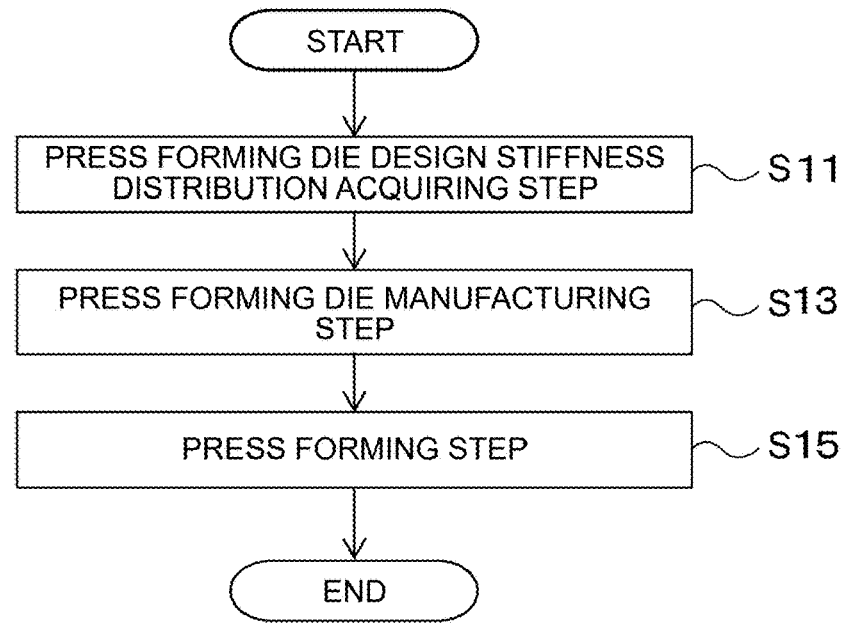
FIG. 8 is a flowchart of a manufacturing method of a press formed part according to a third embodiment.

A manufacturing method of a press formed part according to the third embodiment of the present invention is to manufacture a real press-forming die based on design stiffness distributions of a press forming die acquired by the designing method of the press forming die described in the first embodiment, and to manufacture a press formed part by using the real press-forming die. As illustrated in FIG. 8, the manufacturing method of the press formed part includes a press forming die design stiffness distributions acquiring step S11, a press forming die manufacturing step S13, and a press forming step S15.

<Press Forming Die Design Stiffness Distributions Acquiring Step>

The press forming die design stiffness distributions acquiring step S11 is a step of acquiring design stiffness distributions of a press forming die by the designing method of the press forming die of the first embodiment described above. The design stiffness distributions of the press forming die which distributions are acquired in the press forming die design stiffness distributions acquiring step S11 are acquired by determination of changed stiffness distributions of the die model as the design stiffness distributions of the press forming die when a predetermined range of a press forming load is reached in the press forming die design stiffness determining step S9 described above.

<Press Forming Die Manufacturing Step>

The press forming die manufacturing step S13 is a step of manufacturing a real press-forming die based on the design stiffness distributions of the press forming die which distributions are acquired in the press forming die design stiffness distributions acquiring step S11. In the press forming die manufacturing step S13, based on the design stiffness distributions of the press forming die, for example, a rib (stiffened member) is arranged at a portion at which a boundary condition is set in such a manner that deformation of the two-dimensional element is restrained and deformation is prevented and which has high rigidity, and a thickness of the real press-forming die in the other portion is determined in such a manner that a deflection amount becomes the same as that of the die model.

Figure 9:
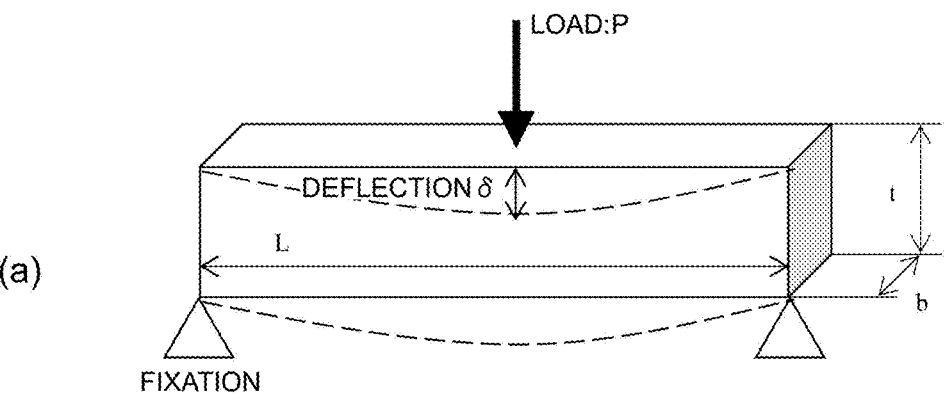
FIG. 9 is a view for describing a determination method of a thickness of a real press-forming die.
Figure 9:
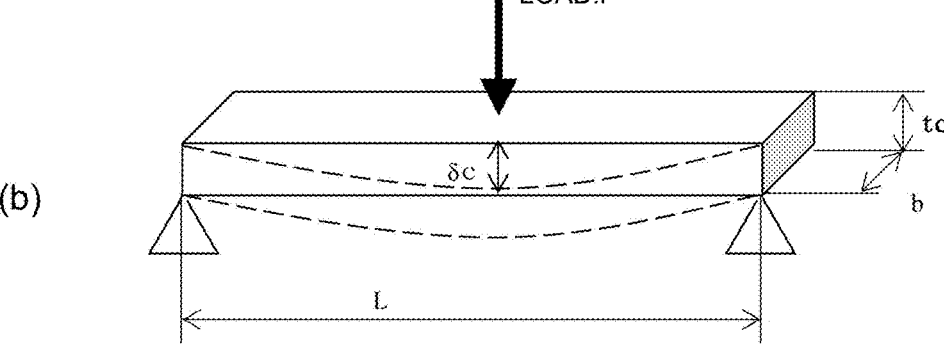

Hereinafter, a concept of a method of determining the thickness of the real press-forming die will be described with reference to FIG. 9. In FIG. 9, elastic deformation of a surface of a die is considered and illustrated as deformation of a simple beam. FIG. 9(a) is a view illustrating a case where the thickness of the real press-forming die is t (mm) and Young's modulus is E (MPa), and FIG. 9(b) is a view illustrating a case where a virtual thickness of the die model is tc (mm) and the Young's modulus is Ec (MPa). In such a manner, the thickness t of the real press-forming die in which a deflection amount $\delta$ of the real press-forming die in FIG. 9(a) and a deflection amount $\delta c$ of the die model in FIG. 9(b) are the same can be determined by an expression (1).

$$t = (Ec/E)^{1/3} \cdot tc \tag{1}$$

<Press Forming Step>

The press forming step S15 is a step of actually performing press forming by using the real press-forming die manufactured in the press forming die manufacturing step S13 and of manufacturing the press formed part.

As described above, in the manufacturing method of the press formed part according to the third embodiment, it is possible to manufacture the press formed part by using the real press-forming die having an appropriate press forming load corresponding to pressurizing capacity of a press forming machine. As a result, it is possible to control a decrease in a life of the press forming die due to excessive pressurization to the press forming die, and it is possible to control generation of a burr or the like of the press formed part and to improve manufacturing efficiency.

First Example

Figure 3:
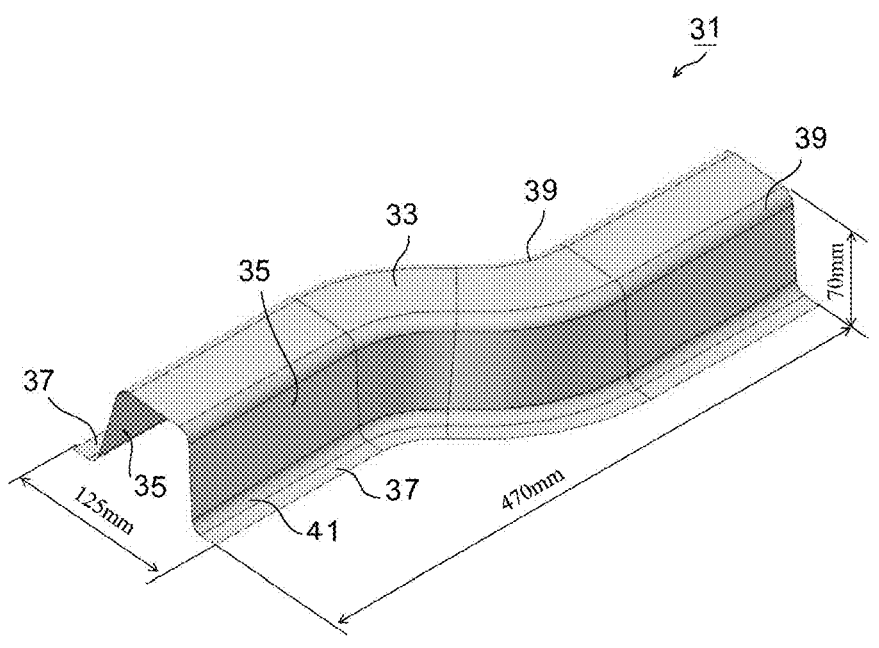
FIG. 3 is a view for describing a shape of a part to be formed in an example.

A specific press forming die was designed to confirm an effect of the present invention, and will be described below. A part shape that is a target of the example is illustrated in FIG. 3. A material of the part is a 1180 MPa-class high-tensile steel sheet having a sheet thickness of 1.6 mm. In press forming of the part, it is necessary to control a cold press load to a maximum load of 245 ton or less due to mechanical restriction of a press machine. Thus, a predetermined press forming load in a forming load determining step in the designing method of the press forming die of the present invention is set to the maximum load of the press forming machine, which is 245 ton.

Figure 4:
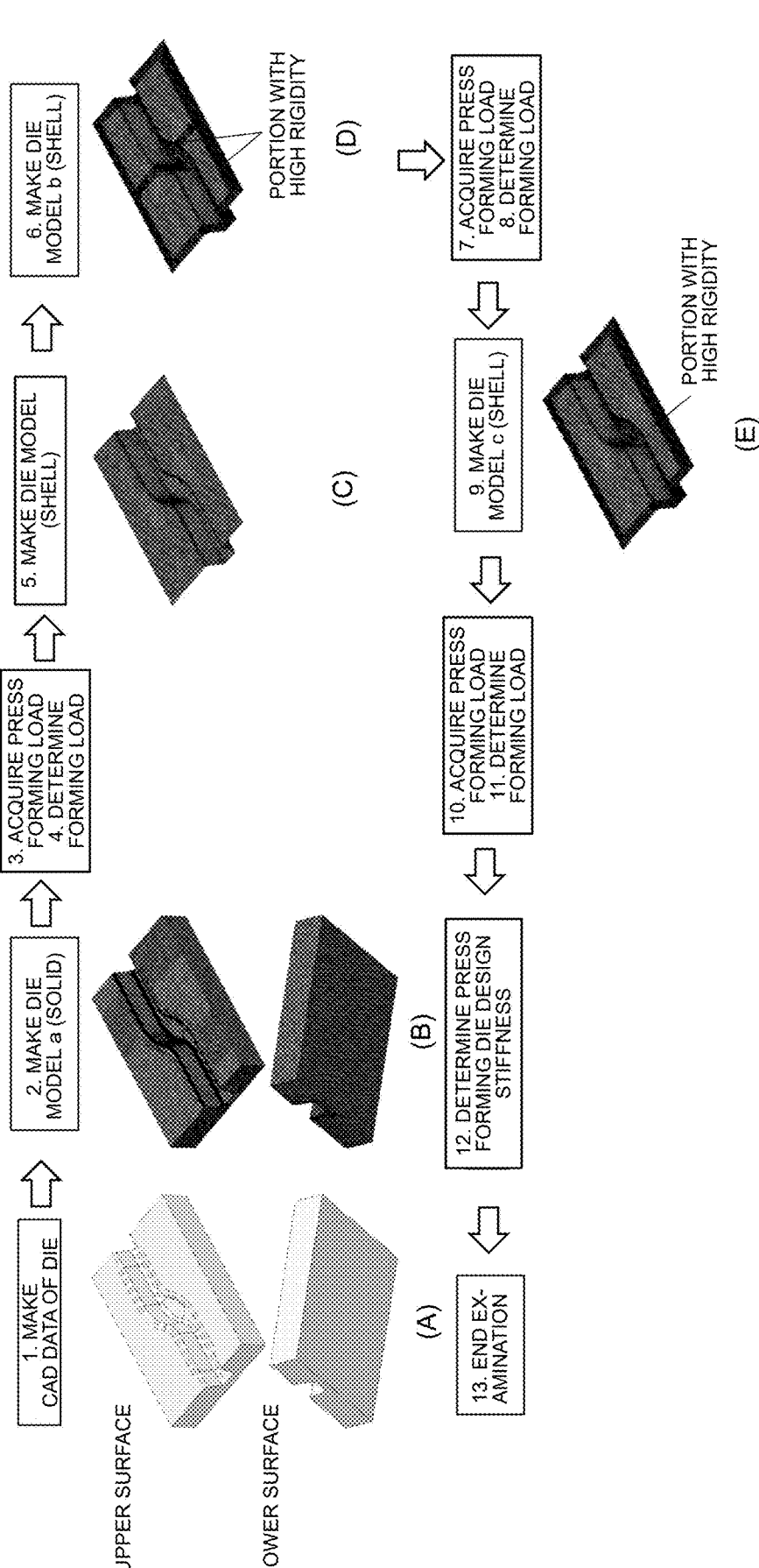
FIG. 4 is a view for describing a shape of a press forming die corresponding to each step of an invention example in the example.

Shapes of a press forming die acquired in steps in an invention example in which the above embodiment was carried out are illustrated in FIG. 4 along a flow of the steps. Each of the steps of the invention example will be described with reference to FIG. 4.

1. First, CAD data of a die of a press forming die was made (FIG. 4(A)).
2. Then, a mesh model of the press forming die was made, and a die model a (solid) by a solid model (three-dimensional element) of a rigid body was made (FIG. 4(B)).
3. A press forming analysis of the press formed part 31 having the part shape illustrated in FIG. 3 was performed by an FEM analysis using the die model a (solid), and a press forming load was acquired.
4. Then, press forming load determination was performed to determine whether the press forming load of the die model a (solid) was equal to or lower than the maximum load of 245 ton. As a result, since the press forming load was 338 ton and exceeded the maximum load of 245 ton by 38.0%, it was determined that further reduction of the press forming load was necessary. Thus, in 5 to 13 in the following, a press forming die capable of reducing the press forming load was designed by utilization of the method and device of designing a press forming die according to the present embodiment.

5. A die model (shell) in which a surface of the press forming die was provided with a virtual thickness by an elastic (nonrigid) shell element (two-dimensional element) was made (FIG. 4(C), die model making step).
6. Then, a highly rigid portion of the press forming die was set in such a manner as not to be displaced by restraint of displacement of the die model (shell) in the range, the displacement of the die model (shell) in the other range was not restrained, and the stiffness distributions of the die model (shell) were set by the boundary condition varied depending on the portion of the die model (shell), whereby a die model b (shell) was made (FIG. 4(D), die model stiffness distribution setting step).
7. A press forming analysis by the FEM analysis using the die model b (shell) in which the stiffness distributions were set was performed, and a press forming load was acquired (press forming load acquiring step).
8. It was determined whether the press forming load of the die model b (shell) was equal to or lower than the maximum load of the press forming machine which maximum load was 245 ton. It was determined that the acquired press forming load of the die model b (shell) was 250 ton and exceeded the maximum load of 245 ton, that further reduction of the press forming load was necessary, and that a predetermined range of the press forming load was not satisfied (press forming load determining step).
9. A die model c (shell) in which the stiffness distributions of the die model were changed by a change in the portion, in which the displacement of the die model (shell) was set to be restrained in the die model b (shell), to be narrower than that of the die model b (shell) was made (FIG. 4(E), die model stiffness distribution setting step repeatedly performed in the press forming die design stiffness determining step).
10. A press forming analysis using the die model c (shell) in which the stiffness distributions were changed was performed, and a press forming load was acquired (press forming load acquiring step repeatedly performed in the press forming die design stiffness determining step).
11. It was determined whether the acquired press forming load of the die model c (shell) was equal to or lower than the maximum load of 245 ton (press forming load determining step repeatedly performed in the press forming die design stiffness determining step). As a result, the press forming load of the die model c (shell) was 234 ton and was reduced to 4.5% below the maximum load of 245 ton. Thus it was determined that the press forming load was within the predetermined range of the press forming load (press forming load determining step repeatedly performed in the press forming die design stiffness determining step).
12. Since the press forming load of the die model c (shell) falls within the predetermined range of the press forming load, the stiffness distributions of the die model c (shell) were determined as the design stiffness distributions of the press forming die of the press formed part 31 having the part shape illustrated in FIG. 3.
13. Thus, the examination was ended. The steps indicated by 9 to 12 in the above correspond to the press forming die design stiffness determining step of the present invention, the step being a step of determining the stiffness distributions of the die model by the shell model as the design stiffness distributions of the press forming die by changing the stiffness distributions of the die model (shell) and repeating the press forming load acquiring step and the press forming load determining step until the press forming load falls within the predetermined range of the press forming load in order to reduce the press forming load.

Figure 5:
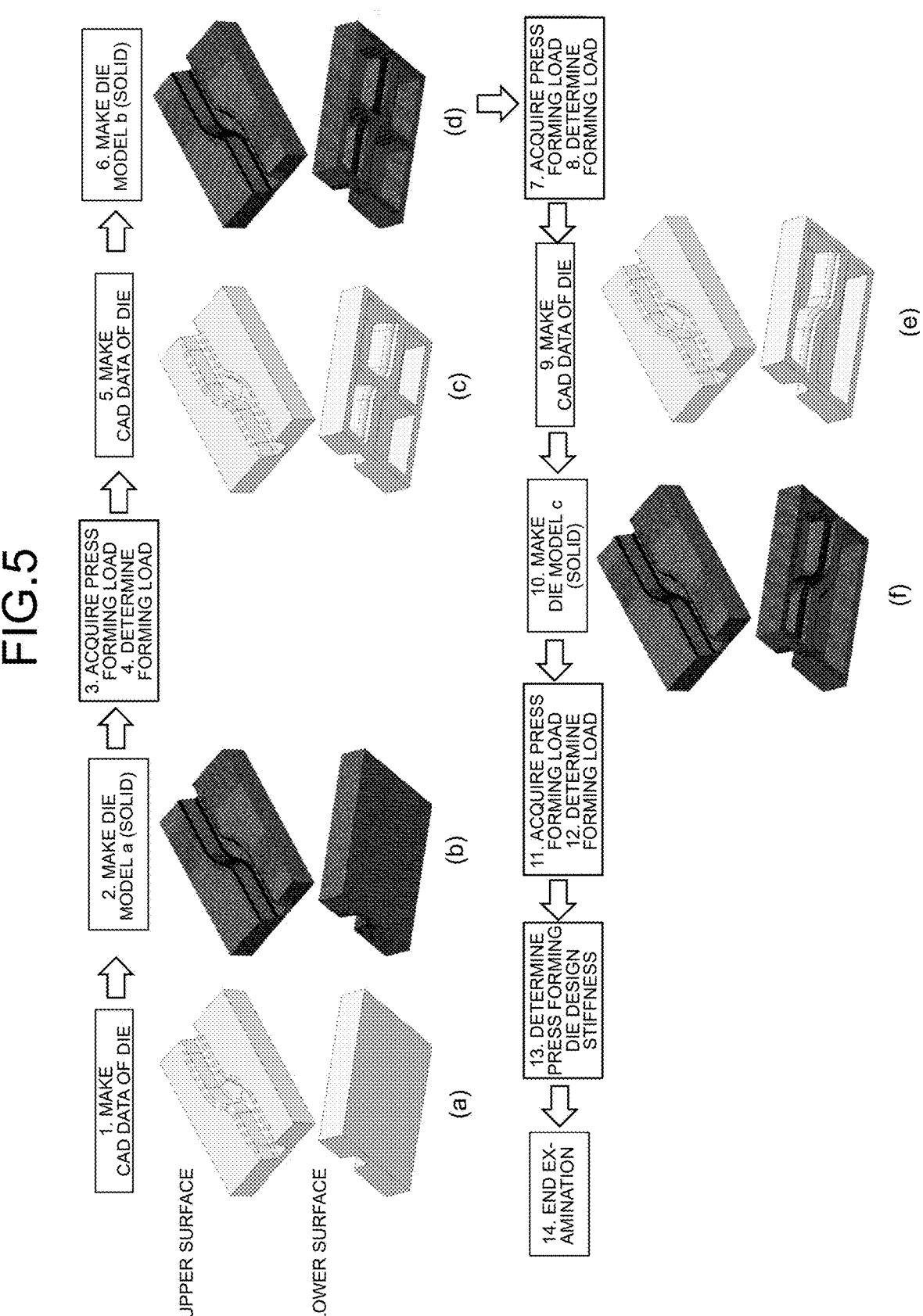
FIG. 5 is a view for describing a shape of a press forming die corresponding to each step of a comparative example in the example.

As a comparative example, a flow of steps of a method of repeating making of CAD data of a die and making of a die model by a solid model is illustrated in FIG. 5. Each of the steps of the comparative example will be described with reference to FIG. 5. Note that steps 1 to 4 in the comparative example are the same as those in the invention example.

1. First, CAD data of a die of a press forming die was made (FIG. 5(*a*)).
2. Then, a mesh model of the press forming die was made, and a die model a (solid) (same as the die model a in the invention example) by a solid model (three-dimensional element) of a rigid body was made (FIG. 5(*b*)).
3. A press forming analysis of the press formed part 31 having the part shape illustrated in FIG. 3 was performed by an FEM analysis using the die model a (solid), and a press forming load was acquired.
4. Then, press forming load determination was performed to determine whether the press forming load of the die model a (solid) was equal to or lower than the maximum load of 245 ton. Here, since the press forming load was 338 ton as described in the invention example and exceeded the maximum load of 245 ton by 38.0%, it was determined that further reduction of the press forming load was necessary.
5. A press-forming die structure was reviewed, and the CAD data of a die of the press forming die in which press-forming die structure was changed was made (FIG. 5(*c*)).
6. From the CAD data of a die of the press forming die in which the press-forming die structure was changed, a mesh model of the press forming die was made, and a die model b (solid) by a solid model of a rigid body was made (FIG. 5(*d*)).
7. A press forming load was acquired by performance of a press forming analysis by an FEM analysis using the made die model b (solid).
8. The press forming load of the die model b (solid) was 248 ton and was slightly more than the maximum load of 245 ton by 1.2%, and it was determined that further reduction of the press forming load was necessary.
9. In order to further reduce the press forming load, the press-forming die structure was reviewed, and the CAD data of a die of the press forming die in which the press-forming die structure was changed again was made (FIG. 5(*e*)).
10. From the CAD data of a die of the press forming die in which the press-forming die structure was changed again, a mesh model of the press forming die was made, and a die model c (solid) by a solid model of a rigid body was 25 made (FIG. 5(*f*)).
11. A press forming load was acquired by performance of a press forming analysis by an FEM analysis using the made die model c (solid).
12. Since the press forming load of the die model c (solid) was 228 ton and was reduced to 6.9% lower than the maximum load of 245 ton, the press forming load determination was OK.
13. Since the press forming load of the die model c (solid) falls within the predetermined range of the press forming load, the stiffness distributions of the die model c (solid) were determined as the design stiffness distributions of the press forming die of the press formed part 31 having the part shape illustrated in FIG. 3.
14. Thus, the examination was completed.

Figure 6:
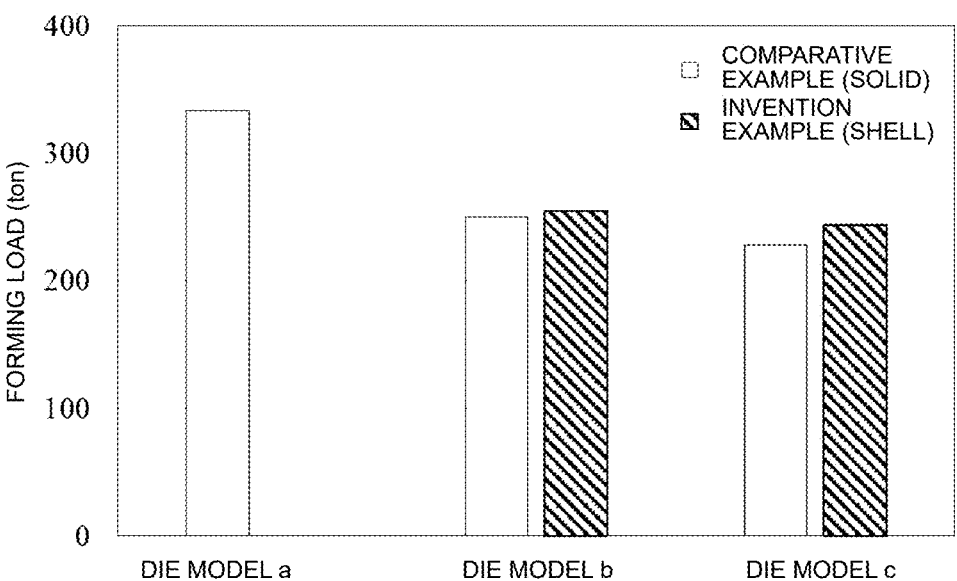
FIG. 6 is a graph illustrating press forming loads in press forming dies of the invention example and the comparative example.

Press forming loads obtained by the press forming analysis using the die model a (solid), the die model b (shell) of the shell element according to the present invention, and the die model c (shell) and press forming loads of the die model b (solid) and the die model c (solid) of the solid element obtained by the comparative example are compared and illustrated in FIG. 6 This shows that the die model b (shell) and the die model c (shell) of the shell element and the die model b (solid) and the die model c (solid) of the solid element have substantially the same press load estimation accuracy.

Figure 7:
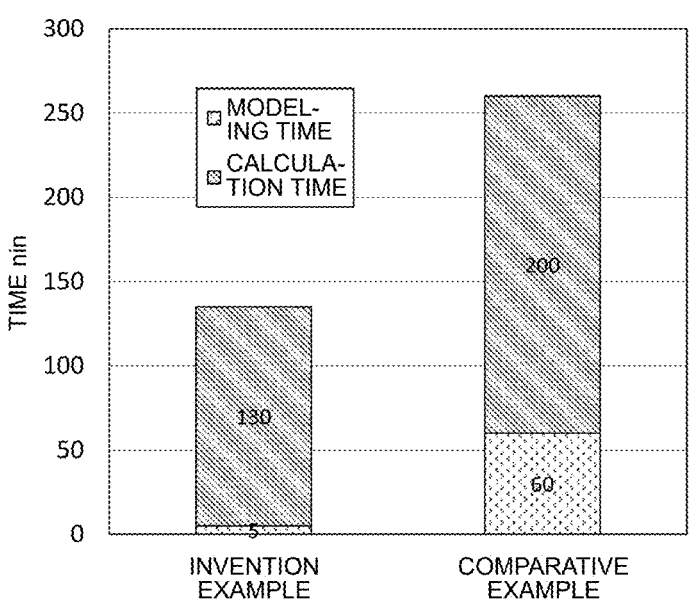
FIG. 7 is a graph illustrating required time of the invention example and the comparative example.

A comparison of required time (modeling time and calculation time) in the invention example and the comparative example is illustrated in FIG. 7. As illustrated in FIG. 7, the modeling time in the comparative example was 60 min, the calculation time was 200 min, and a total was 260 min. On the other hand, the modeling time in the invention example was 5 min, the calculation time was 130 min, and the total was 135 min, and 48% of the calculation time in the comparative example could be shortened.

As described above, it is demonstrated that it is possible to shorten the design time without impairing the accuracy by application of the present invention.

In the invention example in the above example, steps of making CAD data of a die, making the die model a (solid) based thereon, and acquiring a press forming load of the die model a (solid) are performed. However, since there is a case where the CAD data of a die and the die model a (solid) already exist. In that case, the present invention may be applied by utilization of these pieces of data. That is, in the present invention, it is not essential to make the CAD data of a die and the die model a (solid).

Second Example

In the second example, a real press-forming die was manufactured based on design stiffness distributions of the press forming die with which the press formed part 31 in FIG. 3 was formed, the design stiffness distributions being acquired in the first example (die design stiffness distributions acquiring step), and the press formed part 31 was press-formed by utilization of the real press-forming die.

Figure 10:
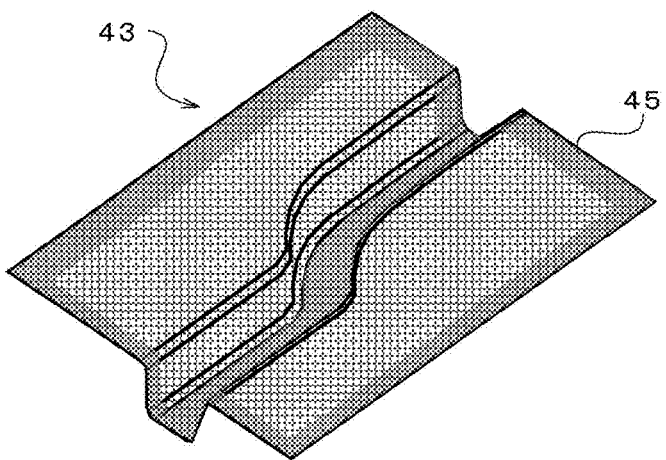
FIG. 10 is a view illustrating design stiffness distributions in a die model of a first example.

FIG. 10 is a view illustrating design stiffness distributions 43 in the die model c (shell) of the first example. FIG. 10 corresponds to a die in a real press-forming die (punch, die, and the like) with which a part illustrated in FIG. 3 is formed. A punch or the like that is another real press-forming die has a shape corresponding to the die. The real press-forming die (die) will be described below as an example. In FIG. 10, a color of a portion 45 having high rigidity is dark gray.

Figure 11:
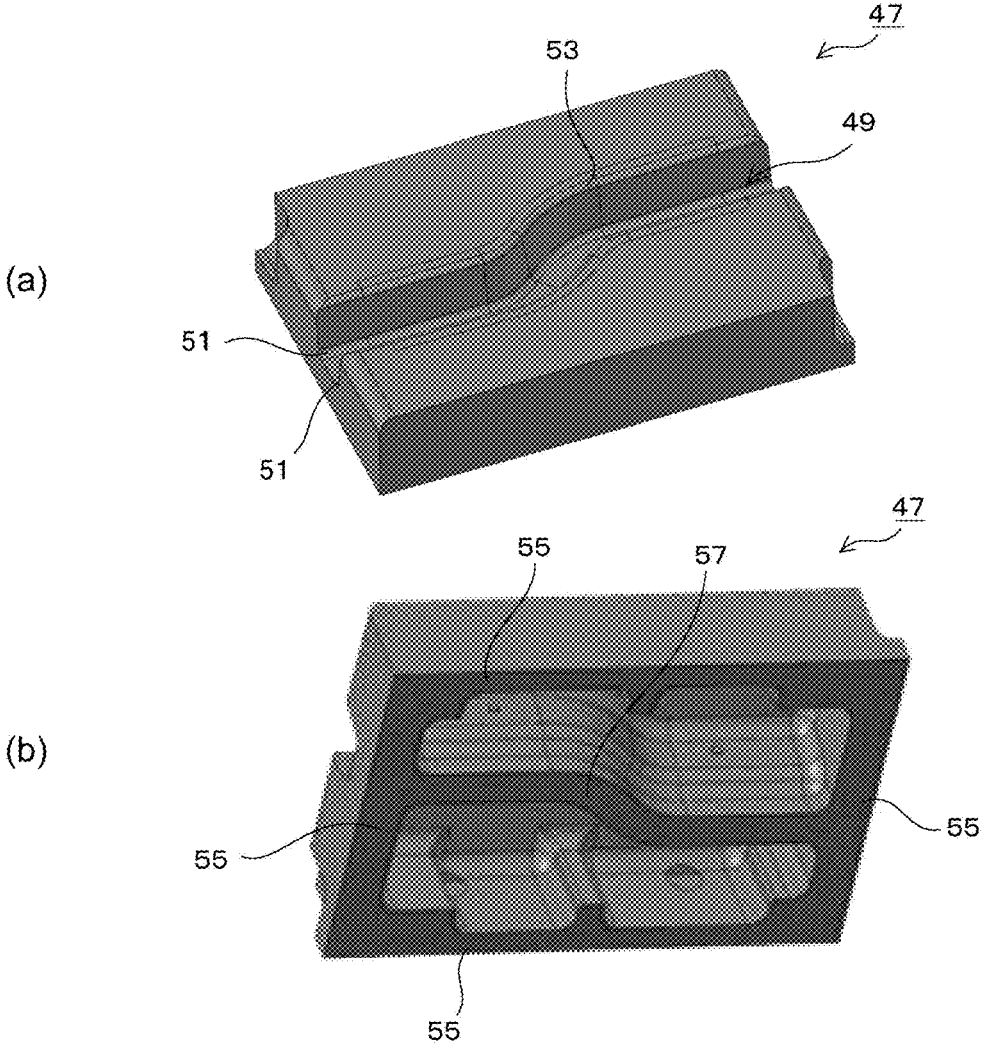
FIG. 11. is a view for describing a real press-forming die 47 manufactured based on the design stiffness distributions of the press forming die in FIG. 10, FIG. 11(*a*) being a view of a forming surface, and FIG. 11(*b*) being a view of a lower surface of the die.

A real press-forming die 47 manufactured based on the design stiffness distributions 43 of the press forming die of FIG. 10 is illustrated in FIG. 11. A groove shape portion 49 corresponding to the part is formed on a forming surface side of the real press-forming die 47, and first R portions 51 corresponding to shoulder parts of a punch 39 of the press formed part 31 are respectively included on both sides of a groove bottom. A second R portion 53 corresponding to a shoulder part of a die 41 of the press formed part 31 is provided at an inlet of the groove.

As illustrated in FIG. 11, the real press-forming die 47 is a rib portion 55 in which a peripheral edge is not deformed in a manner corresponding to a portion 45 that has high rigidity and that is dark gray in the design stiffness distributions 43 of the press forming die in FIG. 10. In addition, a portion corresponding to the groove bottom is also a portion corresponding to a rib 57 which portion is not deformed. A portion other than the rib portion 55 and the portion corresponding to the rib 57 is a deformed portion, and a thickness thereof is 10 mm calculated by the expression (1).

An actual press forming load of when the press formed part 31 was press-formed by utilization of the real press-forming die 47 was 240 ton and was 2.1% lower than the maximum load (245 ton) due to mechanical restriction of the press machine. From this, it was shown that the press formed part 31 can be manufactured by the real press-forming die 47 having an appropriate press forming load corresponding to the pressurizing capacity of the press machine according to the present invention.

INDUSTRIAL APPLICABILITY

According to the present invention, it is possible to provide a method, device, and program of designing a press forming die which can be designed in a short time and with which a press forming load is reduced. Furthermore, according to the present invention, it is possible to provide a manufacturing method of a press formed part in which method a press formed part is manufactured by a real press-forming die manufactured based on a designed press forming die.

REFERENCE SIGNS LIST

1 DESIGNING DEVICE OF PRESS FORMING DIE
3 DISPLAY DEVICE
5 INPUT DEVICE
7 MEMORY STORAGE
9 WORKING DATA MEMORY
11 ARITHMETIC PROCESSING UNIT
13 DIE MODEL MAKING UNIT
15 DIE MODEL STIFFNESS DISTRIBUTION SETTING UNIT
17 PRESS FORMING LOAD ACQUISITION UNIT
19 PRESS FORMING LOAD DETERMINATION UNIT
21 PRESS FORMING DIE DESIGN STIFFNESS DETERMINATION UNIT
31 PRESS FORMED PART
33 TOP PORTION
35 SIDE WALL PORTION
37 FLANGE PORTION
39 SHOULDER PART OF PUNCH
41 SHOULDER PART OF DIE
43 DESIGN STIFFNESS DISTRIBUTION OF PRESS FORMING DIE
45 PORTION WITH HIGH RIGIDITY
47 REAL PRESS-FORMING DIE
49 GROOVE SHAPE PORTION
51 FIRST R PORTION
53 SECOND R PORTION
55 RIB PORTION
57 PORTION CORRESPONDING TO RIB

14

The invention claimed is:

1. A manufacturing method of a press forming die, comprising:
a die model making step of making a die model in which a surface of the press forming die is provided with a virtual thickness by a nonrigid two-dimensional element;
a die model stiffness distribution setting step of setting stiffness distributions of the die model by making a boundary condition of the two-dimensional element vary depending on a portion of the die model;
a press forming load acquiring step of acquiring a press forming load by performing a press forming analysis by using the die model in which the stiffness distributions are set;
a press forming load determining step of determining whether the press forming load is within a predetermined range of the press forming load; and
a press forming die design stiffness determining step of determining the set stiffness distributions of the die model as design stiffness distributions of the press forming die in a case where it is determined in the press forming load determining step that the press forming load is within the predetermined range of the press forming load; and
changing the stiffness distributions of the die model in the die model stiffness distribution setting step and repeating the press forming load acquiring step and the press forming load determining step until the press forming load falls within the predetermined range of the press forming load in a case where it is determined in the press forming load determining step that the predetermined range of the press forming load is not within the predetermined range of the press forming load, and determining the changed stiffness distributions of the die model as the design stiffness distributions of the press forming die when the press forming load falls within the predetermined range of the press forming load; and
a press forming die design stiffness distributions acquiring step of acquiring the design stiffness distributions of a press forming die;
a press forming die manufacturing step of manufacturing a real press-forming die based on the acquired design stiffness distributions of the press forming die; and
a press forming step of performing press forming by using the real press-forming die.

2. The manufacturing method of a press forming die according to claim 1, wherein the boundary condition in the die model stiffness distribution setting step is any one or combination of: displacement restraint; Young's modulus; a sheet thickness; density; mass; and yield strength.

3. The manufacturing method of a press forming die according to claim 1, wherein the nonrigid two-dimensional element is an elastic or elasto-plastic two-dimensional element.

4. The manufacturing method of a press forming die according to claim 2, wherein the nonrigid two-dimensional element is an elastic or elasto-plastic two-dimensional element.

* * * * *